(12) United States Patent
Sato et al.

(10) Patent No.: US 7,727,584 B2
(45) Date of Patent: Jun. 1, 2010

(54) DIELECTRIC DEVICE AND ITS MANUFACTURING METHOD

(75) Inventors: Kei Sato, Tokai (JP); Nobuyuki Kobayashi, Nagoya (JP); Tsutomu Nanataki, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 172 days.

(21) Appl. No.: 11/961,142

(22) Filed: Dec. 20, 2007

(65) Prior Publication Data

US 2008/0199730 A1  Aug. 21, 2008

(30) Foreign Application Priority Data

Feb. 19, 2007 (JP) .............................. 2007-038069
Jun. 5, 2007 (JP) .............................. 2007-148838

(51) Int. Cl.
*B05D 1/12* (2006.01)
(52) U.S. Cl. ..................... 427/201; 427/100; 427/376.1
(58) Field of Classification Search .................. 427/201, 427/376.1, 100
See application file for complete search history.

(56) References Cited

U.S. PATENT DOCUMENTS 6,808,697 B2 * 10/2004 Harada et al. ............... 423/598
2006/0012279 A1   1/2006 Nanataki et al.

FOREIGN PATENT DOCUMENTS

| JP | 04-188503 | 7/1992 |
|---|---|---|
| JP | 2002-217465 | 8/2002 |
| JP | 2004-043893 | 2/2004 |
| JP | 2005-183361 | 7/2005 |
| JP | 2005-344171 | 12/2005 |

OTHER PUBLICATIONS

Akedo et al., "Microstructure and Electrical Properties of Lead Zirconate Titanate ($Pb/Zr_{52}/Ti_{48})O_3$) Thick Films Deposited by Aerosol Deposition Method". Jpn. J. Appl. Phys. vol. 38 (1999), pp. 5397-5401.
Adachi et al., "Preparation of Piezoelectric Thick Films using a Jet Printing System". Jpn. J. Appl. Phys. vol. 36 (1997), pp. 1159-1163.

* cited by examiner

*Primary Examiner*—Frederick J Parker
(74) *Attorney, Agent, or Firm*—Burr & Brown (57) ABSTRACT

A manufacturing method of a dielectric device includes steps described below. (1) Mixing step: Powders serving as a matrix and additive powders for sintering the matrix are mixed. (2) Mixture heat-treating step: The mixture of the matrix and the additive that has been subject to the mixing step is heat-treated. (3) Deposition layer formation step: The material powders obtained through the mixture heat-treating step are injected toward a substrate so as to form a deposition layer on the substrate. (4) Deposition layer heat-treating step: The deposition layer formed on the substrate through the deposition layer formation step is heat-treated so as to form the dielectric layer on the substrate.

5 Claims, 5 Drawing Sheets

DIELECTRIC DEVICE AND ITS MANUFACTURING METHOD

BACKGROUND OF THE INVENTION

1. Field of the Invention

The present invention relates to a dielectric device having a substrate and a dielectric layer formed on the substrate, and its manufacturing method.

2. Description of the Related Art

A known manufacturing method of a dielectric device includes a method for forming the dielectric layer on the substrate by injecting dielectric particles to the substrate (e.g., aerosol deposition method, etc.). The manufacturing method of this type is disclosed in, for example, Japanese Patent Application Laid-Open (kokai) No. 2004-43893, Japanese Patent Application Laid-Open (kokai) No. 2005-344171, or the like.

In the manufacturing method described above, crystallinity of the layer formed of the particles is deteriorated due to the collision between the substrate and the particles. Therefore, the formed layer is subject to a heat treatment. This heat treatment recovers the crystallinity of the dielectric layer, with the result that satisfactory characteristics (piezoelectric characteristic, etc.) of the dielectric layer can be obtained.

[Patent Document 1]
Japanese Patent Application Laid-Open (kokai) No. 2004-43893

[Patent Document 2]
Japanese Patent Application Laid-Open (kokai) No. 2005-344171

SUMMARY OF THE INVENTION

Demand has been increasing for realizing more satisfactory characteristics while enhancing deposition property of the dielectric layer.

The dielectric device according to the present invention includes a substrate and a dielectric layer.

A low heat-resistant substrate (silicon substrate, glass substrate, stainless substrate, etc.) can preferably be used for the substrate.

The dielectric layer is formed on the substrate in such a manner that material powders are injected to the substrate to form the deposition layer on the substrate, and then, the deposition layer is subject to a heat treatment. The material powders are composed of a heat-treated mixture. The mixture includes, a dielectric and a sintering aid for sintering the dielectric.

A manufacturing method according to the present invention includes the steps described below.

(1) Mixing step: Powders that are a matrix and additive powders for sintering the matrix powders are mixed.

(2) Mixture heat-treating step: The mixture of the matrix and the additives that has been subject to the mixing step is heat-treated (e.g., at not more than 900° C./preferably at not less than 600° C.).

(3) Deposition layer formation step: The material powders obtained through the mixture heat-treating step are injected to the substrate, thereby forming a deposition layer on the substrate.

(4) Deposition layer heat-treating step: The deposition layer formed on the substrate through the deposition layer formation step is heat-treated, thereby forming the dielectric layer on the substrate. The heat-treatment temperature in the deposition layer heat-treating step is preferably not more than the temperature at the mixture heat-treating step (e.g., at not more than 700° C. if the heat-treatment temperature for the mixture is not less than 700° C.).

The matrix is the dielectric or its raw material (precursor), and the additive is the sintering aid or its raw material.

Examples of preferably used dielectric include barium titanate, lead zirconate, magnesium niobate, lead nickel niobate, lead zinc niobate, lead manganese niobate, lead magnesium tantalate, lead nickel tantalate, lead antimony stannate, lead titanate, lead magnesium tungstate, lead cobalt niobate, sodium niobate, potassium niobate, potassium tantalate, sodium tantalate, lithium niobate, lithium tantalate, and ceramics containing arbitrary combination thereof. Specifically, lead zirconate titanate (PZT) and its solid solution (PMN (lead magnesium niobate)-PZT, PNN (lead nickel niobate)-PZT, PZN (lead zinc niobate)-PZT, etc.) can preferably be used as the dielectric.

The matrix containing any one of the above-mentioned materials in an amount of not less than 50 weight % as the main component can be used as the dielectric, for example. Further, ceramic produced by further adding compounds such as oxides to the above can also be preferably used as the dielectric. Examples of the above-mentioned oxides include lanthanum, calcium, strontium, molybdenum, tungsten, barium, niobium, zinc, nickel, manganese, cerium, cadmium, chrome, cobalt, antimony, iron, yttrium, tantalum, lithium, bismuth, tin, silicon, or the like. The above-mentioned oxides can be used singly, or a combination of plural oxides can be used.

Examples of the sintering aid include $ZnO$—$Bi_2O_3$, $Pb_5GeO_{11}$ (PGO), $LiBiO_3$, $CuO$, $Ag$, low-melting glass, etc.

In the manufacturing method of the present invention, the mixture of the matrix and the additive is heat-treated (at a temperature not less than the temperature at the deposition layer heat-treating step) at the mixture heat-treating step. By virtue of this step, the additive can satisfactorily be permeated to the matrix before the deposition. Therefore, the additive satisfactorily functions as the sintering aid at the deposition layer heat-treating step (that is the heat treatment at the temperature not more than the temperature at the mixture heat-treating step).

According to the manufacturing method of the present invention, the dielectric layer having excellent characteristics can be formed with good deposition property. Specifically, according to the present invention, the dielectric device having excellent characteristics can be manufactured with more stability.

Since the heat-treatment temperature at the deposition layer heat-treating step is not more than 700° C., in particular, the dielectric layer having more excellent characteristic can be formed with good deposition property even if a relatively low heat-resistant material (silicon substrate, glass substrate, stainless substrate, etc.) is used as the substrate.

A pulverizing step may be performed between the mixture heat-treating step and the deposition layer formation step. The pulverizing step is for obtaining the material powders by pulverizing the treated substance that has been subject to the heat treatment at the mixture heat-treating step.

It is preferable that the material powder, which has a half-value width of 0.3 to 0.5°, with the diffraction angle of 2θ, of the peak of (101) plane at a spectrum of a powder X-ray diffraction ray obtained by the irradiation of Cu—Kα ray, is used in the deposition layer formation step.

When the half-value width is not more than 0.3°, the deposition property at the deposition layer formation step is poor. This result is considered by the following reason.

The deposition in an aerosol deposition method has the mechanism described below, for example. The particles of the material powders accelerated to subsonic speed collide with the substrate. By this collision, a high-speed deformation accompanied by the deviation of crystal plane or movement of dislocation is produced, resulting in that the crystal structure is made fine to become dense. At this time, a formation of a new plane or a movement of substances based upon the impact force is produced, with the result being that interparticle bonding is formed.

When the half-value width is not more than 0.3° in this case (when the crystallinity of the dielectric in the material powder is too great), the deviation of the crystal plane in the dielectric is hardly produced due to the influence of the additive (the sintering acid), and therefore, the deposition according to the above-mentioned mechanism is hardly performed.

BRIEF DESCRIPTION OF THE DRAWINGS

Various other objects, features and many of the attendant advantages of the present invention will be readily appreciated as the same becomes better understood by reference to the following detailed description of the preferred embodiment when considered in connection with the accompanying drawings, in which.

DETAILED DESCRIPTION OF THE INVENTION

A preferable embodiment of the present invention will be explained with reference to examples and comparative examples.

<Schematic Configuration of FED Using Electron Emitter as Dielectric Device>

Figure 1:
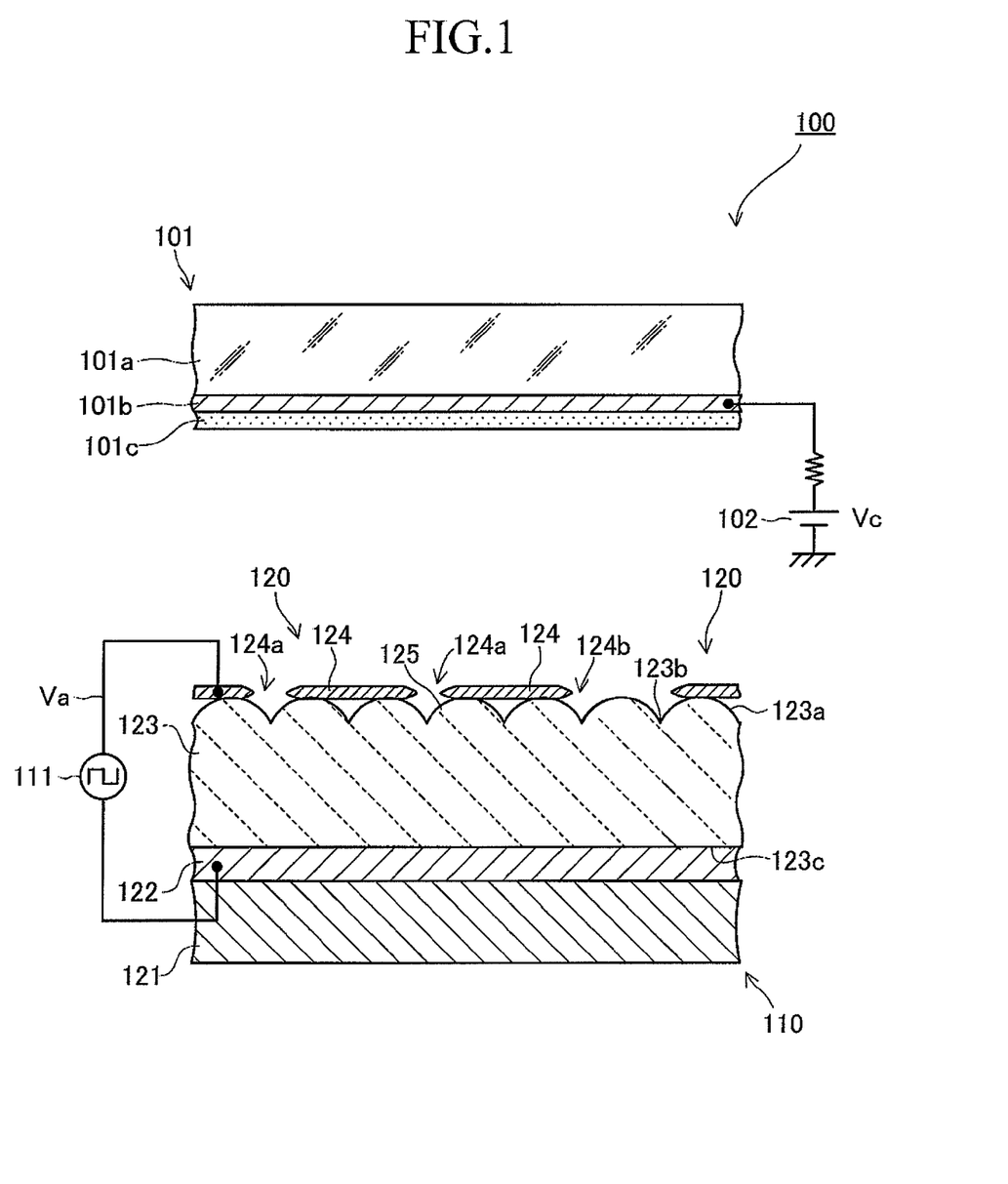
FIG. 1 is a cross-sectional view showing a schematic configuration of a display to which an electron emitter, which serves as a dielectric device, according to the present invention is applied.

FIG. 1 is a cross-sectional view showing a schematic configuration of a field emission display (FED) to which a dielectric device according to the present invention is applied.

With reference to FIG. 1, the FED 100 includes a light-emitting panel 101. The light-emitting panel 101 includes a transparent plate 101a, a collector electrode 101b, and a phosphor layer 101c.

The transparent plate 101a is formed of a glass plate or an acrylic plate. The collector electrode 101b is formed on the surface on the lower side in FIG. 1 of the transparent plate 101a. The collector electrode 101b is formed of a transparent electrode such as an ITO (indium tin oxide) thin film.

The phosphor layer 101c is formed below the collector electrode 101b. The phosphor layer 101c is configured such that when electrons flying toward the collector electrode 101b, which is connected to a bias voltage source 102 via a predetermined resistor, collide with the phosphor layer 101c, fluorescence can be emitted. The bias voltage source 102 is configured to apply a predetermined collector voltage Vc between the ground and the collector electrode 101b.

An electron-emitting device 110 is provided below the light-emitting panel 101. The electron-emitting device 110 is electrically connected to a pulse generator 111. The electron-emitting device 110 is configured such that when a drive voltage Va is applied thereto by means of the pulse generator 111, electrons are emitted toward the light-emitting panel 101 (the collector electrode 101b and the phosphor layer 101c).

A predetermined space is provided between the electron-emitting device 110 and the light-emitting panel 101 (phosphor layer 101c). The space between the electron-emitting device 110 and the phosphor layer 101c is a reduced-pressure atmosphere having a predetermined vacuum level of, for example, $10^2$ to $10^{-6}$ Pa, and more preferably, $10^{-3}$ to $10^{-5}$ Pa.

The FED 100 is configured such that electrons are emitted, to the reduced-pressure atmosphere, from the electron-emitting device 110 through application of the drive voltage Va to the device 110 by means of the pulse generator 111, and that, by means of an electric field generated through application of the collector voltage Vc, the thus-emitted electrons fly toward the collector electrode 101b and collide with the phosphor layer 101c, whereby fluorescence is emitted.

<Configuration of Electron-Emitting Device>

The electron-emitting device 110 is configured so as to have a thin flat plate shape. The electron-emitting device 110 includes a number of two-dimensionally arranged electron emitters 120 serving as the dielectric device according to the present embodiment.

Each of the electron emitters 120 includes a substrate 121, a lower electrode 122, a dielectric layer 123, and an upper electrode 124.

The substrate 121 is formed of a low heat-resistant substrate (silicon substrate, glass substrate, stainless substrate, etc.). The lower electrode 122 is formed on the substrate 121. The lower electrode 122 is made of a metal film having a thickness not more than 20 μm. The lower electrode 122 is electrically connected to the aforementioned pulse generator 111. The dielectric layer 123 is provided on the lower electrode 122.

Microscopic concavities and convexities due to, for example, crystal grain boundaries are formed on an upper surface 123a of the dielectric layer 123. Specifically, numerous concavities 123b are formed on the upper surface 123a.

The dielectric layer 123 is formed on the lower electrode 122 such that a lower surface 123c of the layer 123, which is opposite the upper surface 123a, is in intimate contact with the lower electrode 122. The upper electrode 124 is formed on the upper surface 123a of the dielectric layer 123. The upper electrode 124 is electrically connected to the aforementioned pulse generator 111.

The upper electrode 124 is formed of a thin layer that has a thickness of about 0.1 to 20 μm and is made of a conductive substance. Examples of the conductive substance constituting the upper electrode 124 include a metallic film, metallic particle, nonmetallic conductive film (carbon film or nonmetallic conductive oxide film, etc.), nonmetallic conductive particle (carbon particle, conductive oxide particle, etc.).

Examples of the material for the metallic film or metallic particle include platinum, gold, silver, iridium, palladium, rhodium, molybdenum, and tungsten, and alloy of these materials. Preferable examples of the material for the nonmetallic conductive film or nonmetallic conductive particle include graphite, ITO (indium tin oxide), or LSCO (lanthanum strontium cobalt oxide). Preferable shapes of particles in case where the upper electrode 124 is made of a metallic particle or nonmetallic conductive particle include a scale-like shape, plate-like shape, foil-like shape, acicular shape, rod-like shape, coiled spring-like shape, etc.

The upper electrode 124 has a plurality of openings 124a. The openings 124a are formed such that the upper surface 123a of the dielectric layer 123 is exposed to the outside of the electron-emitting device 110 (i.e., the aforementioned reduced-pressure atmosphere; the same shall apply hereinafter). The upper surface 123a of the dielectric layer 123 is exposed to the outside of the electron-emitting device 110 also at peripheral edge portions 124b of the upper electrode 124. A portion of the dielectric layer 123 exposed to the outside of the electron-emitting device 110 constitutes an emitter section 125, which serves as a main section for electron emission.

As described below, the electron emitter 120 is configured such that electrons supplied from the upper electrode 124 are accumulated on the emitter section 125, and the thus-accumulated electrons are emitted toward the outside of the electron-emitting device 110 (i.e., toward the phosphor layer 101c).

Figure 2:
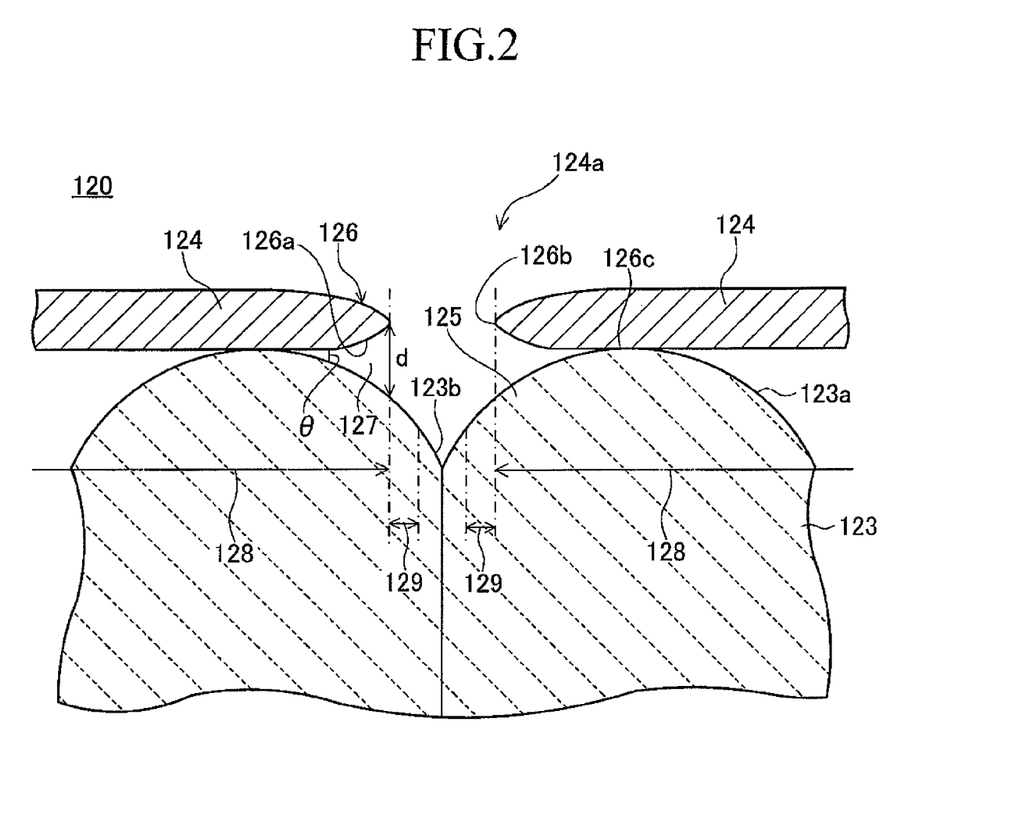
FIG. 2 is an enlarged cross-sectional view showing essential portions of the electron emitter shown in FIG. 1.

FIG. 2 is an enlarged cross-sectional view showing essential portions of the electron emitter 120 of FIG. 1. In the case shown in FIG. 1 or FIG. 2, the concavities 123b and the openings 124a are formed in one-to-one correspondence. However, in some cases, a plurality of concavities 123b may be formed in a single opening 124a, or no concavities 123b may be formed in an opening 124a.

Referring to FIG. 2, in the upper electrode 124, an overhang portion 126, which is a portion in the vicinity of the opening 124a, is provided so as to overhang the emitter section 125. Specifically, the overhang portion 126 is formed such that a lower surface 126a and a tip end 126b of the overhang portion 126 are apart from the upper surface 123a of the dielectric layer 123 corresponding to the emitter section 125. The overhang portion 126 is also formed at positions corresponding to the peripheral edge portions 124b (see FIG. 1) of the upper electrode 124.

A triple junction 126c is formed at a position of the base end at which the overhang portion 126 is in contact with the upper surface 123a of the dielectric layer 123; i.e., at a position at which the dielectric layer 123 is in contact with the upper electrode 124 and the aforementioned reduced-pressure atmosphere.

The triple junction 126c is a site (electric field concentration point) at which lines of electric force concentrate (where electric field concentration occurs) when, as shown in FIG. 1, a drive voltage Va is applied between the lower electrode 122 and the upper electrode 124. As used herein, the expression "site at which lines of electric force concentrate" refers to a site at which lines of electric force that are generated from the lower electrode 122 at even intervals concentrate, when the electric force lines are drawn under the assumption that the lower electrode 122, the dielectric layer 123, and the upper electrode 124 are flat plates each having infinite length in a sectional side view. The state of the concentration of lines of electric force (i.e., the state of electric field concentration) can be readily observed through simulation by means of numerical analysis employing the finite-element method.

Referring again to FIG. 2, a gap 127 is formed between the lower surface 126a and tip end 126b of the overhang portion 126 and the upper surface 123a (emitter section 125) of the dielectric layer 123. The gap 127 is formed such that the maximum gap d satisfies the following relation: $0\ \mu m < d \leqq 10$ μm, and the angle θ between the lower surface 126a and the surface of the emitter section 125 satisfies the following relation: $0° < \theta \leqq 60°$.

The tip end 126b of the overhang portion 126 has such a shape as to serve as the aforementioned electric field concentration point. Specifically, the overhang portion 126 has such a cross-sectional shape as to be acutely pointed toward the tip end 126b of the portion 126; i.e., the thickness gradually decreases.

The openings 124a may be formed to assume a variety of shapes as viewed in plane (as viewed from above in FIG. 2), including a circular shape, an elliptical shape, a polygonal shape, and an irregular shape. The openings 124a are formed such that the average of diameters of the openings 124a as viewed in plane is 0.1 μm or more and 20 μm or less. The reason for this is described below. As used herein, the expression "the average of diameters of the openings 124a" refers to the number-based average of diameters of circles having areas identical to those of the openings 124a.

As shown in FIG. 2, regions of the dielectric layer 123 where polarization is inverted in accordance with application of the aforementioned drive voltage (drive voltage Va shown in FIG. 1) are first regions 128 and second regions 129. The first regions 128 correspond to regions facing the upper electrode 124. The second regions 129 correspond to regions extended from the tip ends 126b of the overhang portions 126 toward the centers of the openings 124a to some extent. The range of the second regions 129 varies depending on the level of the drive voltage Va and the degree of electric field concentration in the vicinity of the second regions 129.

When the average diameter of the openings 124a falls within the above-described range (i.e., 0.1 μm or more and 20 μm or less), a sufficient quantity of electrons are emitted through the openings 124a, and high electron emission efficiency is secured.

When the average diameter of the openings 124a is less than 0.1 μm, the area of the second regions 129 decreases. The second regions 129 constitute primary regions of the emitter section 125 which temporarily accumulates electrons supplied from the upper electrode 124 and then emits the electrons. Therefore, a decrease in area of the second regions 129 results in reduction of the quantity of electrons to be emitted. In contrast, when the average diameter of the openings 124a exceeds 20 μm, the ratio of the second regions 129 to the entirety of the emitter section 125 (occupancy of the second regions) decreases, resulting in reduction of electron emission efficiency.

<Electron Emission Principle of Electron Emitter>

Figure 3:
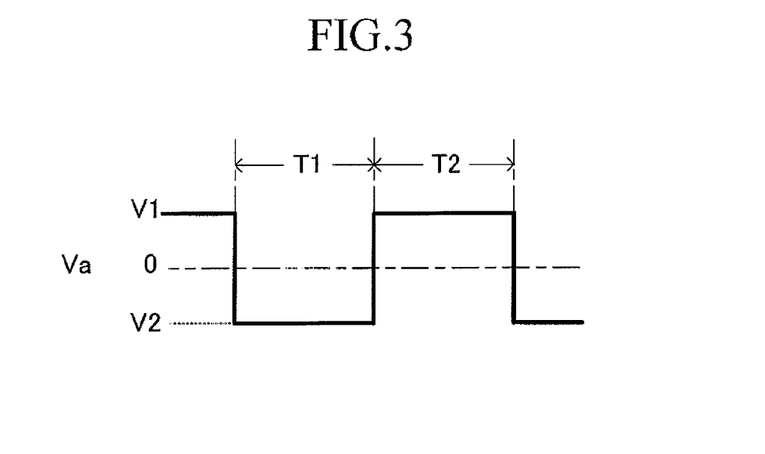
FIG. 3 is a diagram showing a waveform of a driving voltage applied to the electron emitter shown in FIG. 1.
Figure 4:
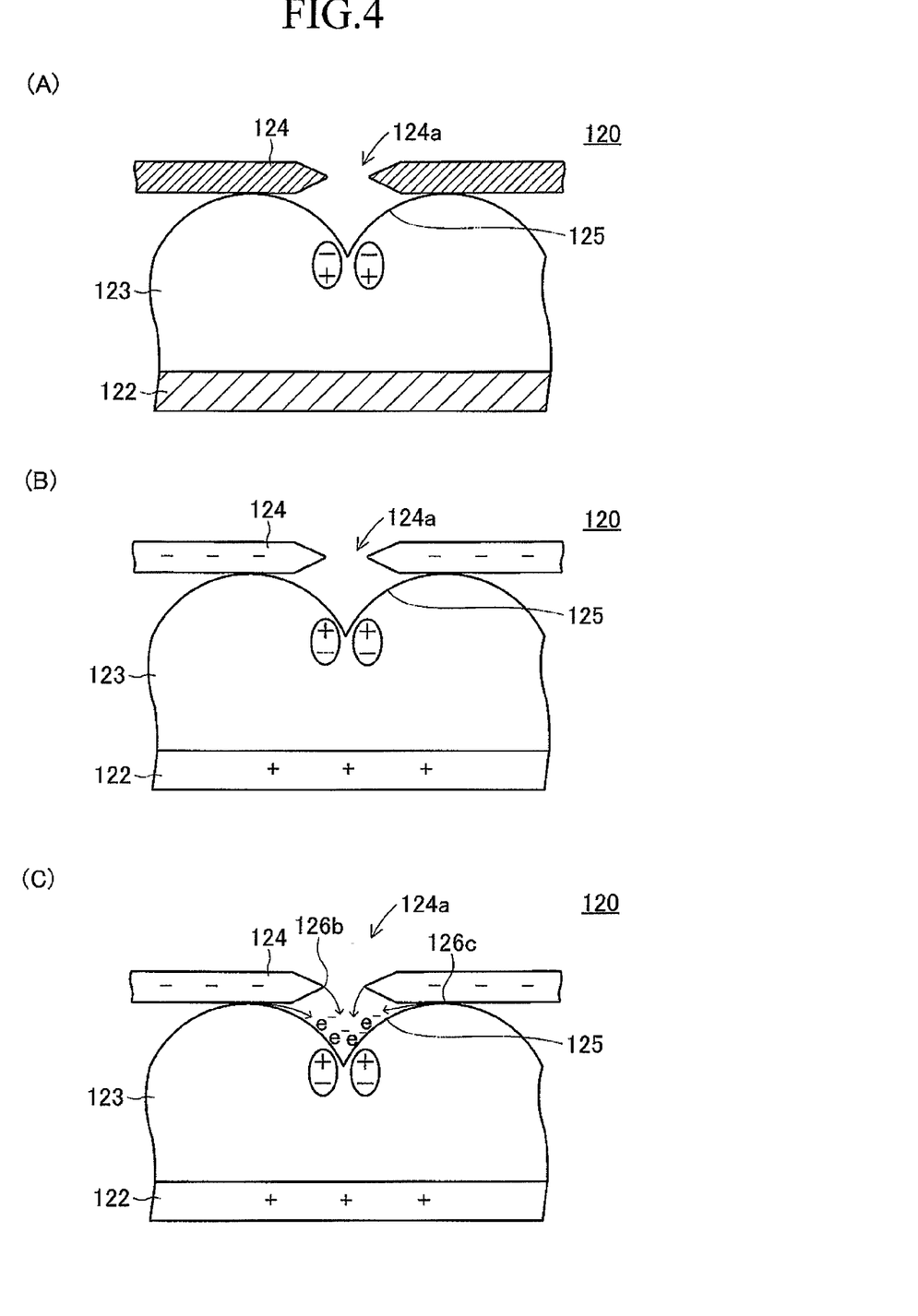
FIG. 4 is a schematic view for explaining an operation of the electron emitter shown in FIG. 1.
Figure 5:
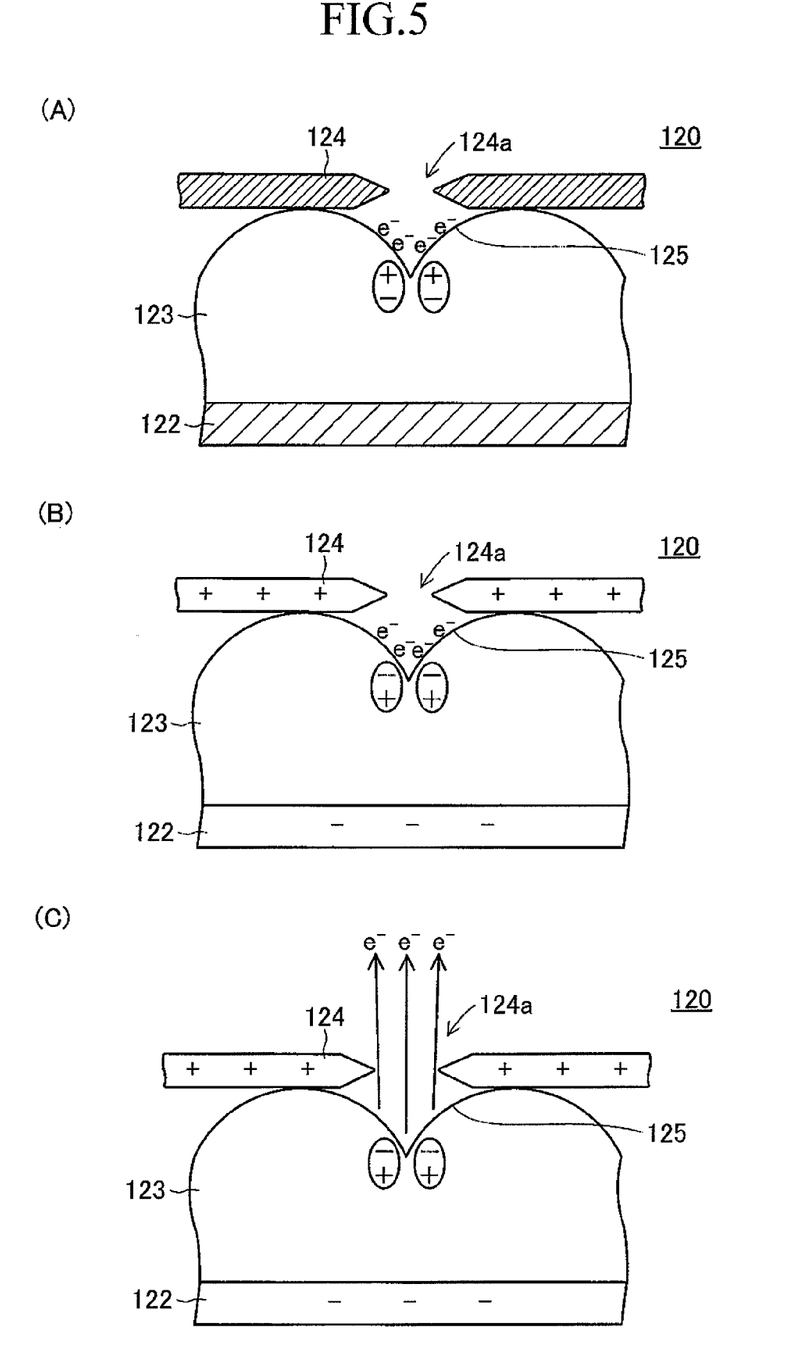
FIG. 5 is a schematic view for explaining an operation of the electron emitter shown in FIG. 1.

FIG. 3 is a diagram showing the waveform of a drive voltage Va applied to the electron emitter 120 shown in FIG. 1. FIGS. 4 and 5 each show the state of operation of the electron emitter 120 of FIG. 1 in the case where the drive voltage Va shown in FIG. 3 is applied to the electron emitter 120. Next will be described the principle of electron emission of the electron emitter 120 with reference to FIGS. 3 to 5.

In the present embodiment, as shown in FIG. 3, the drive voltage Va to be applied is an alternating voltage of rectangular waveform (period: T1+T2). In the drive voltage Va, the reference voltage (voltage corresponding to the center of the wave) is 0 V.

As shown in FIGS. 3 to 5, in the drive voltage Va, during time T1 corresponding to the first stage, the electric potential of the upper electrode 124 is V2 (negative voltage), which is lower than the electric potential of the lower electrode 122, and during time T2 corresponding to the second stage, the electric potential of the upper electrode 124 is V1 (positive voltage), which is higher than the electric potential of the lower electrode 122.

As shown in FIG. 4A, in the initial state, the emitter section 125 is polarized unidirectionally, and the negative poles of dipoles face toward the upper surface 123a of the dielectric layer 123.

Firstly, in the initial state, in which the reference voltage is applied, as shown in FIG. 4A, the emitter section 125 is polarized such that the negative poles of dipoles face toward the upper surface 123a of the dielectric layer 123. In this state, virtually no electrons are accumulated on the emitter section 125.

Subsequently, as shown in FIG. 4B, when the negative voltage V2 is applied, polarization is inverted. This inversion of polarization causes electric field concentration to occur at the aforementioned electric field concentration points. Through this electric field concentration, electrons are supplied from the electric field concentration points of the upper electrode 124 toward the emitter section 125, and then, as shown in FIG. 4C, electrons are accumulated on the emitter section 125. In other words, the emitter section 125 is electrically charged. This electrical charging can be continued until a predetermined saturated condition, which depends on the surface resistance of the dielectric layer 123, is attained. The quantity of the charge can be controlled on the basis of voltage application time or voltage waveform. Thus, the upper electrode 124 (in particular, the aforementioned electric field concentration points) functions as an electron supply source for the emitter section 125.

Subsequently, when the drive voltage Va is changed to the reference voltage as shown in FIG. 5A, and then the positive voltage V1 is applied as the drive voltage Va as shown in FIG. 5B, polarization is re-inverted. As a result, electrostatic repulsion between the accumulated electrons and the negative poles of dipoles causes the electrons to be emitted from the emitter section 125 toward the outside of the electron emitter 120 through the opening 124a as shown in FIG. 5C.

In a manner similar to that described above, electrons are emitted from the peripheral edge portions 124b (see FIG. 1) of the upper electrode 124.

<Dielectric Device Manufacturing Method>

Figure 6:
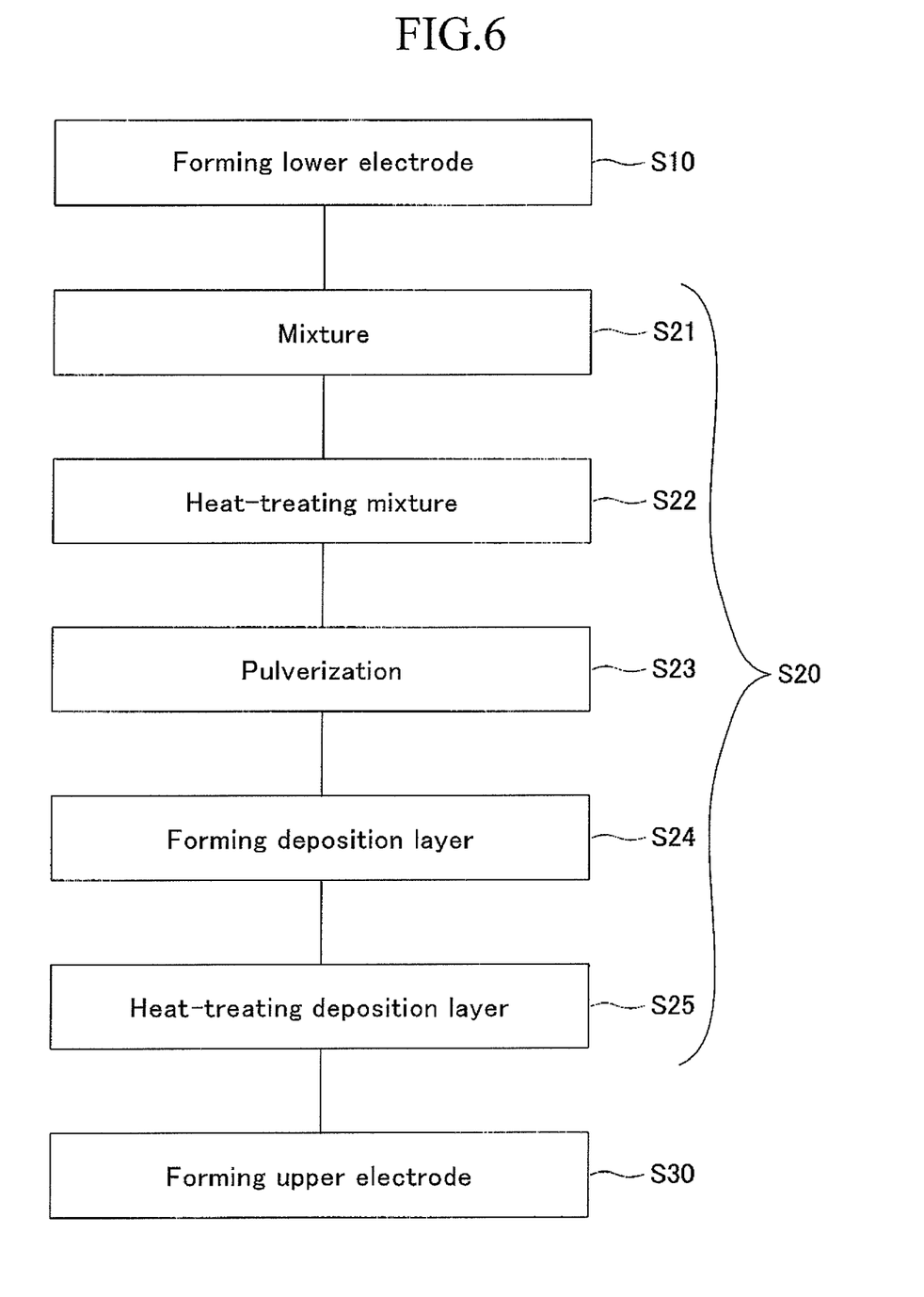
FIG. 6 is a process flow chart showing an embodiment of a manufacturing method of the electron emitter shown in FIG. 1.

Next will be described one embodiment of a manufacturing method for the electron emitter 120 having the above-mentioned configuration with reference to the process flowchart shown in FIG. 6. In the following explanation, aforementioned reference numerals of FIG. 1 and FIG. 2 are appropriately referred to for illustrating components of the electron emitter 120.

Firstly, a lower electrode 122 is formed on a substrate 121 (the lower electrode formation step S10). In the lower electrode formation step S10, an applied film of a metallic paste is formed by a screen printing. Then, this applied film is heat-treated. Thus, the lower electrode 122 made of the metallic film is formed on the substrate 121.

Next, the dielectric layer 123 is formed on the lower electrode 122 formed on the substrate 121 (dielectric layer formation step S20).

In the dielectric layer formation step S20, a mixing step S21, a mixture heat-treating step S22, a pulverizing step S23, a deposition layer formation step S24, and a deposition layer heat-treating step S25 are performed.

Firstly, in the mixing step S21, dielectric powders and sintering aid powders are mixed by means of a ball mill.

Then, in the mixture heat-treating step S22, the mixture of the dielectric powders and sintering aid powders is heat-treated (at relatively high temperature: i.e., at a high temperature not less than a temperature at a later-described deposition layer heat-treating step S25).

Subsequently, in the pulverizing step S23, the heat-treated mixture of the dielectric powders and sintering aid powders is pulverized by means of a ball mill to have a particle diameter that can satisfactorily be formed into a film by an aerosol deposition method. Thus, material powders in the aerosol deposition method can be obtained.

Thereafter, in the deposition layer formation step S24, the above-mentioned material powders are injected on the lower electrode 122 formed on the substrate 121 by the aerosol deposition method. Thus, a deposition layer is formed on the lower electrode 122.

Finally, in the deposition layer heat-treating step S25, the above-mentioned deposition layer is heat-treated at a relatively low temperature (not more than 700° C.). Thus, the crystallinity is recovered, so that the dielectric layer 123 having an excellent dielectric property can be obtained.

The upper electrode 124 is formed on the dielectric layer 123, which is formed on the substrate 121 as described above, by a screen printing method similar to the lower electrode formation step S10 (upper electrode formation step S30).

EXAMPLES

Next will be described, with reference to Comparative Examples, Examples of the aforementioned manufacturing method.

In each of the Examples and Comparative Examples, a platinum electrode serving as the lower electrode 122 is formed, by a screen printing method, on the substrate 121 made of a stabilized zirconia at the lower electrode formation step S10. Next, the dielectric layer having a thickness of about 5 to 7 µm is formed by an aerosol deposition method on the platinum electrode at the dielectric layer formation step S20. The mixing condition in the mixing step S21 is such that the mixing is performed for three hours by using a ball mill. Subsequently, in the upper electrode formation step S30, a gold electrode serving as the upper electrode 124 is formed by the screen printing method. In the Examples and Comparative Examples, the overhang structures (overhang portions 126) are not formed at the upper electrode 124 for simplifying the experiment, but from a viewpoint of making a remanent polarization Pr (µC/cm$^2$) as an evaluation item, as described later.

As Comparative Examples, a dielectric device having no additive (sintering aid) and a dielectric device having additive but not subject to the mixture heat-treating step S22 (the dielectric powders and sintering aid powders are only mixed) are employed.

A half-value width (2θ) of the peak at the (101) plane in a powder X-ray diffraction spectrum, which employs Cu—Kα ray (wavelength: 1.5418 angstroms) of the material powder obtained by the pulverizing step S23, and the remanent polarization Pr when the AC electric field is applied between the lower electrode 122 and the upper electrode 124, are obtained for each of the Examples and Comparative Examples.

The powder X-ray diffraction spectrum is obtained by "RAD-IB" manufactured by RIGAKU Corporation. The half-value width is acquired by Gaussian fitting by means of an image processing software for a personal computer.

The remanent polarization Pr is obtained from a hysteresis curve by the application of AC electric field of a triangular wave having a frequency of 100 Hz and amplitude of 200 kV/cm. The remanent polarization Pr in the case where the heat-treatment temperature at the deposition layer heat-treating step S25 is 600° C. and the remanent polarization Pr in the case where the heat-treatment temperature at the deposition layer heat-treating step S25 is 700° C. are respectively measured.

Example 1

The Example in which a solid solution of lead zinc niobate and lead zirconate titanate (PZN-PZT) is used as the matrix and ZnO—$Bi_2O_3$ is employed as an additive will be explained with reference to Comparative Example.

The PZN-PZT as the matrix in the Example 1 is 0.15 PZN($Zn_{1/3}Nb_{2/3}$)–0.85PZT (Zr/Ti=0.52:0.48). This is a solid solution in which mol fraction of lead zinc niobate, having a ratio of zinc to niobium of 1/3:2/3, and lead zirconate titanate having a ratio of zirconium to titanate of 0.52:0.48, is 0.15:0.85. This matrix is referred to as "ZN" and the additive is referred to as "BZ" hereinbelow.

The "calcination condition" in Table 1 indicates the heat-treatment temperature and heat-treatment time in the mixture heat-treating step S22, while the "pulverization condition" indicates the processing time in the pulverizing step S23.

TABLE 1

|  | Matrix | Additive | Calcination condition | Pulverization condition |
| --- | --- | --- | --- | --- |
| Comparative Example 1-1 | ZN | — | — | — |
| Comparative Example 1-2 | ZN | BZ | — | — |
| Example 1-1 | ZN | BZ | 850° C. × 3 h | 10 h |
| Example 1-2 | ZN | BZ | 850° C. × 3 h | 4 h |
| Example 1-3 | ZN | BZ | 850° C. × 3 h | 2 h |
| Example 1-4 | ZN | BZ | 850° C. × 3 h | 1 h |
| Comparative Example 1-3 | ZN | BZ | 920° C. × 3 h | 1 h |

The additive (sintering aid) is not used in the Comparative Example 1-1. In the Comparative Example 1-2, the additive is used, but only mixed. In the Examples 1-1 to 1-4 and the Comparative Example 1-3, the heat-treatment (calcination) is performed after the additive is added and mixed, wherein the calcination condition and the pulverization condition are changed. Table 2 shows the result of the evaluation by the aforesaid evaluation method for each of the Examples and the Comparative Examples in Table 1.

TABLE 2

|  | (101) Half-width | Pr [$\mu C/cm^2$] (Heat-treatment 600° C. after deposition) | Pr [$\mu C/cm^2$] (Heat-treatment 700° C. after deposition) |
| --- | --- | --- | --- |
| Comparative Example 1-1 | 0.4521 | 9.2 | 13.6 |
| Comparative Example 1-2 | 0.456 | 5.3 | 8 |
| Example 1-1 | 0.5282 | 10.5 | 15.4 |
| Example 1-2 | 0.4482 | 11.5 | 19.44 |
| Example 1-3 | 0.4006 | 12.9 | 26.5 |
| Example 1-4 | 0.3761 | 20.0 | 36.2 |
| Comparative Example 1-3 | 0.2454 | Non-measurable since layer is not deposited | |

As apparent from the result of the evaluation in Table 2, the properties of the Examples 1-1 to 1-4 that have been subject to the mixture heat-treating step S22 are more enhanced than those of the Comparative Example 1-1 having no additive and the Comparative Example 1-2 in which the additive is only mixed. The property of the Comparative Example 1-2 in which the additive is only mixed is deteriorated rather than the property of the Comparative Example 1-1 having no additive.

In particular, the properties are remarkably enhanced in the Examples 1-2 to 1-4 in which the calcination temperature is not more than 900° C. and the (101) half-value width (2θ) is within the range of 0.3 to 0.5.

In the case of the Comparative Example 1-3 in which the (101) half-value width is less than 0.3°, the deposition of the layer is poor in the deposition layer formation step S24.

As apparent from Tables 1 and 2, the (101) half-value width has a tendency to be increased as the calcination temperature is lowered and the pulverization time is increased. However, the powder having the (101) half-value width of not less than 0.53 can not be obtained even when the calcination condition and pulverization condition are changed.

Example 2

Next, the Example in which the material is the same as that in the Example 1 is used as the matrix and $Pb_5Ge_3O_{11}$ (PGO) is used as the additive will be explained with reference to the Comparative Example.

TABLE 3

|  | Matrix | Additive | Calcination condition | Pulverization condition |
| --- | --- | --- | --- | --- |
| Comparative Example 2 | ZN | PGO | — | — |
| Example 2 | ZN | PGO | 850° C. × 3 h | 2 h |

In the Comparative Example 2, the additive is added, but the additive is only mixed. In the Example 2, the heat-treatment (calcination) is performed after the additive is added and mixed. Table 4 shows the result of the evaluation of the Example and Comparative Example shown in Table 3.

TABLE 4

|  | (101) Half-width | Pr [$\mu C/cm^2$] (Heat-treatment 600° C. after deposition) | Pr [$\mu C/cm^2$] (Heat-treatment 700° C. after deposition) |
| --- | --- | --- | --- |
| Comparative Example 2 | 0.452 | 6 | 10.3 |
| Example 2 | 0.421 | 9.2 | 15.3 |

As apparent from the result of the evaluation in Table 4, the property of the Example 2 that has been subjected to the mixture heat-treating step S22 is more enhanced than that of the Comparative Example 2 in which the additive is only mixed. The property of the Comparative Example 2 in which the additive is only mixed is deteriorated further than the property of the Comparative Example 1-1 having no additive.

Next, the Example in which PZT (Zr/Ti=0.52:0.48) is used as the matrix and BZ and PGO are used as the additive will be explained with reference to the Comparative Example.

TABLE 5

|  | Matrix | Additive | Calcination condition | Pulverization condition |
| --- | --- | --- | --- | --- |
| Comparative Example 3 | PZT | — | — | — |
| Example 3-1 | PZT | PGO | 850° C. × 3 h | 2 h |
| Example 3-2 | PZT | BZ | 850° C. × 3 h | 2 h |

In the Comparative Example 3, the additive (sintering aid) is not contained. In the Example 3-1, PGO is employed as the additive, and the heat treatment (calcination) is performed after the additive is added and mixed. In the Example 3-2, BZ is employed as the additive, and the heat treatment (calcination) is performed after the additive is added and mixed. The calcination condition and pulverization condition performed in both Examples are the same. Table 6 shows the result of the evaluation of the Examples and Comparative Example shown in Table 5.

TABLE 6

| | (101) Half-width | Pr [$\mu C/cm^2$] (Heat-treatment 600° C. after deposition) | Pr [$\mu C/cm^2$] (Heat-treatment 700° C. after deposition) |
|---|---|---|---|
| Comparative Example 3 | 0.467 | 10.8 | 14.7 |
| Example 3-1 | 0.412 | 12.5 | 18.2 |
| Example 3-2 | 0.388 | 11.8 | 17.4 |

As apparent from the result of the evaluation shown in Table 6, it is confirmed that the properties are remarkably enhanced in the Examples 3-1 and 3-2 in which the heat treatment (calcinations) is performed after the addition and mixture of the additive, and the (101) half-value width of the obtained material powder is within the range of 0.3 to 0.5°, even if the matrix is changed from ZN to PZT.

Example 4

Next, the Example in which a lead magnesium niobate-lead titanate-lead zirconate ternary solid solution composition (PMN(Mg$_{1/3}$Nb$_{2/3}$)-PT-PZ) is used as the matrix, and PGO is used as the additive will be explained with reference to the Comparative Example. The PMN-PT-PZ as the matrix in the Example 4 is 37.5PMN-37.5PT-25PZ. The "37.5PMN-37.5PT-25PZ" is an abbreviation of PMN—PT-PZ ternary solid solution composition of lead magnesium niobate:lead titanate:lead zirconate=37.5:37.5:25 by mole.

TABLE 7

| | Matrix | Additive | Calcination condition | Pulverization condition |
|---|---|---|---|---|
| Comparative Example 4 | PMN-PT-PZ | — | — | — |
| Example 4 | PMN-PT-PZ | PGO | 850° C. × 3 h | 2 h |

In the Comparative Example 4, no additive (sintering aid) is contained. In the Example 4, the heat treatment (calcination) is performed after the additive is added and mixed. Table 8 shows the result of the evaluation of the Example and Comparative Example shown in Table 7.

TABLE 8

| | (101) Half-width | Pr [$\mu C/cm^2$] (Heat-treatment 600° C. after deposition) | Pr [$\mu C/cm^2$] (Heat-treatment 700° C. after deposition) |
|---|---|---|---|
| Comparative Example 4 | 0.437 | 7 | 12.1 |
| Example 4 | 0.379 | 12.1 | 17.9 |

As apparent from the result of the evaluation shown in Table 8, it is confirmed that the properties are remarkably enhanced in Example 4 in which the heat treatment (calcinations) is performed after the addition and mixture of the additive, and the (101) half-value width of the obtained material powder is within the range of 0.3 to 0.5°, even if the matrix is changed to PMN-PT-PZ.

Example 5

Finally, the Example in which the material is the same as that in the Example 1 is used as the matrix and a low melting point glass is used as the additive will be explained with reference to the Comparative Example.

In the Example 5, PbO—ZnO—B$_2$O$_3$—SiO$_2$ glass (PbO: 60 mol %, ZnO: 25 mol %, B$_2$O$_3$: 10 mol %, SiO$_2$: 5 mol %, glass transition point: 385° C., softening point: 440° C.) is used as the low melting point glass.

In the Comparative Example 5, the additive is added but only mixed. In the Examples 5-1 to 5-3, the heat treatment (calcination) is performed after the additive is added and mixed.

TABLE 9

| | Matrix | Additive | Calcination condition | Pulverization condition |
|---|---|---|---|---|
| Comparative Example 5 | ZN | Low melting point glass | — | — |
| Example 5-1 | ZN | Low melting point glass | 800° C. × 3 h | 3 h |
| Example 5-2 | ZN | Low melting point glass | 900° C. × 3 h | 3 h |
| Example 5-3 | ZN | Low melting point glass | 1000° C. × 3 h | 3 h |

Table 10 shows the result of the evaluation for the Examples and Comparative Example shown in Table 9.

TABLE 10

| | (101) Half-width | Pr [$\mu C/cm^2$] (Heat-treatment 600° C. after deposition) | Pr [$\mu C/cm^2$] (Heat-treatment 700° C. after deposition) |
|---|---|---|---|
| Comparative Example 5 | 0.478 | 6.5 | 12.5 |
| Example 5-1 | 0.402 | 11.3 | 20.7 |
| Example 5-2 | 0.425 | 11.0 | 20.1 |
| Example 5-3 | 0.424 | 11.4 | 21.5 |

As apparent from the result of the evaluation in Table 10, the properties of the Examples 5-1 to 5-3 that have been subjected to the mixture heat-treating step S22 are more enhanced than that of the Comparative Example 5 in which the additive is only mixed. In Comparative Example 5, the deposition property became extremely poor, and the property is deteriorated more than the property of the Comparative Example 1-1 having no additive.

As apparent from the result of the evaluation for the Examples and the Comparative Example, the properties are enhanced in the Examples 1-1 to 1-4 in which the heat treatment (calcination) is performed after the additive is added and mixed. In particular, it is confirmed that the properties are remarkably enhanced in the Examples 1-2 to 1-4 in which the (101) half-value width of the obtained material powders is within the range of 0.3 to 0.5°.

In these Examples, even if the heat treatment temperature in the deposition layer heat-treating step S25 is relatively low such as 600 to 700° C., by which a relatively low heat-resistant substrate (silicon substrate, glass substrate, stainless substrate, etc.) can be used as the substrate 121, a dielectric layer having excellent characteristics could be obtained.

As explained above in the Examples and Comparative Examples, in the present invention, a matrix and a sintering aid are mixed and then calcinated, whereby the sintering aid is sufficiently permeated into the matrix, and therefore, a dense deposition is performed. By the heat treatment (deposition layer heat-treating step) after the deposition, a growth of a crystallite grain or a defect recovery are carried out, whereby various characteristics (remanent polarization, and others) of the dielectric can be enhanced. Accordingly, a dielectric layer having excellent characteristics can be formed with excellent deposition property according to the present invention.

<Suggestion of Modifications>

The above-described embodiment has been disclosed merely to illustrate representative embodiment of the present invention considered as the most preferred embodiments at the time of filing of the present application. Consequently, the present invention is not limited to the above-described embodiments, and it is appreciated that various modifications are possible without changing essential parts of the present invention.

Hereinafter, a few modifications will be illustrated below. In the explanation of the modifications below, like reference numerals refer to like components. In the explanation for the components, the explanation for the above-mentioned embodiment can be quoted within the scope of technical consistency.

It is not necessary to mention that the modifications are not limited to those described below. Further, plural modifications can appropriately be combined with each other within the scope of technical consistency.

The present invention (the components constituting the means to solve the problems of the present invention, which are expressed operatively and functionally) should not be limited based on the disclosures of the embodiments described above and the modifications described below. Limiting the present invention is not allowed because the limitation trespasses on benefits of the applicant, the limitation provides imitators with undue profits, and therefore, the limitation is opposed to the purpose of the patent law prescribing the protection and utilization of the invention.

The dielectric device according to the present invention is not limited to an electron emitter. The present invention is satisfactorily applicable to an optional dielectric device utilizing various characteristics (piezoelectric characteristic, vibration characteristic, etc.) of a dielectric. It is to be noted that an electron emitter is not limited to an FED. The configuration of the electron emitter is also not limited to the configuration of the above-mentioned embodiments. Specifically, the overhang structure (overhang portion 126) at the upper electrode 124 may not be provided, for example.

Besides the mixture by means of a ball mill, various mixing steps are applicable in the mixing step S21.

The mixture heat-treating step S22 can be performed simultaneous with the mixing step S21, or can be performed during the mixing step S21.

The pulverizing step S23 can be omitted.

The deposition layer formation step S24 is not limited to an aerosol deposition method.

The deposition layer heat-treating step S25 can be carried out as the heat-treating step, which is performed subsequent to the screen printing, etc., in the upper electrode formation step S30.

When a low melting point glass is used as the sintering aid, about 600° C. of the heat treatment temperature at the mixture heat-treating step S22 normally suffices in most cases. In this case, the property can be enhanced even if the heat treatment temperature at the deposition layer heat-treating step S25 is 600 to 700° C.

The term "low melting point glass" used herein is a term industrially generally employed, and even if this term is used in the claims, the use of this term does not make the disclosure of the claims unclear. The low melting point glass generally indicates a glass having a glass transition temperature of not more than 600° C. Known low melting point glasses include a lead-based low melting point glass having $ZnO$—$PbO$—$B_2O_3$, $PbO$—$SiO_2$—$B_2O_3$, $PbO$—$P_2O_5$—$SnF_2$, etc. as a main component, or non-lead-based low melting point glass having $V_2O_5$—$ZnO$—$BaO$, $Bi_2O_3$, $CuO$—$P_2O_5$, etc. as a main component.

In addition, the respective components constituting the means to solve the problems of the present invention, particularly, the components which are expressed operatively and functionally, include all structures that can be operatively and functionally realized in addition to the clearly defined structures disclosed in the above-described embodiments and modifications.

What is claimed is:

1. A manufacturing method of a dielectric device comprising:
   a mixing step in which powders serving as a matrix and additive powders for sintering the matrix are mixed;
   a mixture heat-treating step in which the mixture of the matrix and the additive that has been subject to the mixing step is heat-treated;
   a deposition layer formation step in which material powders obtained through the mixture heat-treating step are injected to a substrate so as to form a deposition layer on the substrate, wherein the deposition layer formation step employs material powders containing a dielectric that contains a solid solution of lead zinc niobate and lead zirconate titanate (PZN-PZT), and a sintering aid containing $ZnO$—$Bi_2O_3$; and
   a deposition layer heat-treating step in which the deposition layer formed on the substrate through the deposition layer formation step is heat-treated at a temperature not more than that at the mixture heat-treating step so as to form a dielectric layer on the substrate.

2. A manufacturing method of a dielectric device according to claim 1, further comprising:
   a pulverizing step in which a processed substance that has been heat-treated at the mixture heat-treating step is pulverized so as to obtain the material powders.

3. A manufacturing method of a dielectric device according to claim 2, wherein
   the deposition layer formation step employs the material powders whose half-value width of a peak of (101) plane in a powder X-ray diffraction spectrum obtained by the irradiation of Cu—Kα ray is in the range from 0.3 to 0.5° at a diffraction angle 2θ.

4. A manufacturing method of a dielectric device according to claim 1, wherein
   the deposition layer formation step employs the material powders whose half-value width of a peak of (101) plane in a powder X-ray diffraction spectrum obtained by the irradiation of Cu—Kα ray is in the range from 0.3 to 0.5° at a diffraction angle 2θ.

5. A manufacturing method of a dielectric device comprising:
   a mixing step in which powders serving as a matrix and additive powders for sintering the matrix are mixed;

a mixture heat-treating step in which the mixture of the matrix and the additive that has been subject to the mixing step is heat-treated;

a deposition layer formation step in which material powders obtained through the mixture heat-treating step are injected to a substrate so as to form a deposition layer on the substrate, wherein the deposition layer formation step employs material powders containing a dielectric that contains a solid solution of lead zinc niobate and lead zirconate titanate (PZN-PZT), and a sintering aid containing at least one of $Pb_5GeO_{11}$, $LiBiO_3$, CuO and Ag; and a deposition layer heat-treating step in which the deposition layer formed on the substrate through the deposition layer formation step is heat-treated at a temperature not more than that at the mixture heat-treating step so as to form a dielectric layer on the substrate.

* * * * *